United States Patent [19]

Trautt et al.

[11] Patent Number: 5,672,545
[45] Date of Patent: Sep. 30, 1997

[54] THERMALLY MATCHED FLIP-CHIP DETECTOR ASSEMBLY AND METHOD

[75] Inventors: Thomas A. Trautt, Santa Barbara; Thomas E. Wolverton, Goleta, both of Calif.

[73] Assignee: Santa Barbara Research Center, Goleta, Calif.

[21] Appl. No.: 287,634

[22] Filed: Aug. 8, 1994

[51] Int. Cl.⁶ ................................................. H01L 21/60
[52] U.S. Cl. .................... 437/209; 437/211; 437/214; 437/217
[58] Field of Search .................. 437/209, 210, 437/211, 212, 213, 214, 215, 216, 217, 218, 219, 220, 8

[56] References Cited

U.S. PATENT DOCUMENTS

| | | | |
|---|---|---|---|
| 4,957,882 | 9/1990 | Shinomiya | 437/209 |
| 5,045,142 | 9/1991 | Drake et al. | 437/209 |
| 5,300,458 | 4/1994 | Kuhnert et al. | 437/215 |
| 5,309,980 | 5/1994 | Barton . | |
| 5,352,926 | 10/1994 | Andrews | 437/215 |
| 5,391,514 | 2/1995 | Gall et al. | 437/209 |
| 5,393,696 | 2/1995 | Koh et al. | 437/209 |

OTHER PUBLICATIONS

Norton, Paul R., Infrared Image Sensors, *Optical Engineering*, Nov. 1991, vol. 30, No. 11.
Liu, C. N.,"Matching the Thermal Coefficients of Expansion of Chips to Module Substrate", *IBM Technical Disclosure Bulletin*, vol. 19, No. 12, May 1977, pp. 4666–4667.

*Primary Examiner*—Kevin Picardat
*Attorney, Agent, or Firm*—W. C. Schubert; W. K. Denson-Low

[57] ABSTRACT

A flip-chip assembly and method for reducing the stress in its metal interconnections resulting from thermal mismatch includes a detector that has a radiation sensitive circuit on a substrate that is flip-chip connected to a layer of semiconductor material that is provided with a readout circuit. The substrate has a thermal coefficient of expansion (TCE) greater than the semiconductor layer such that operating the detector over a predetermined temperature range would stress the flip-chip connections. A first compensation layer on the readout chip has a TCE greater than the substrate's, and a second compensation layer on the first layer has a TCE approximately equal to the semiconductor layer's. The materials and thicknesses of the compensation layers are selected such that the TCE of a composite structure that includes the semiconductor and compensation layers is approximately equal to the substrate's TCE to avoid the stress over the predetermined temperature range. In the preferred embodiment, the composite structure is mounted on a platform, which has a TCE approximately equal to that of the substrate.

2 Claims, 2 Drawing Sheets

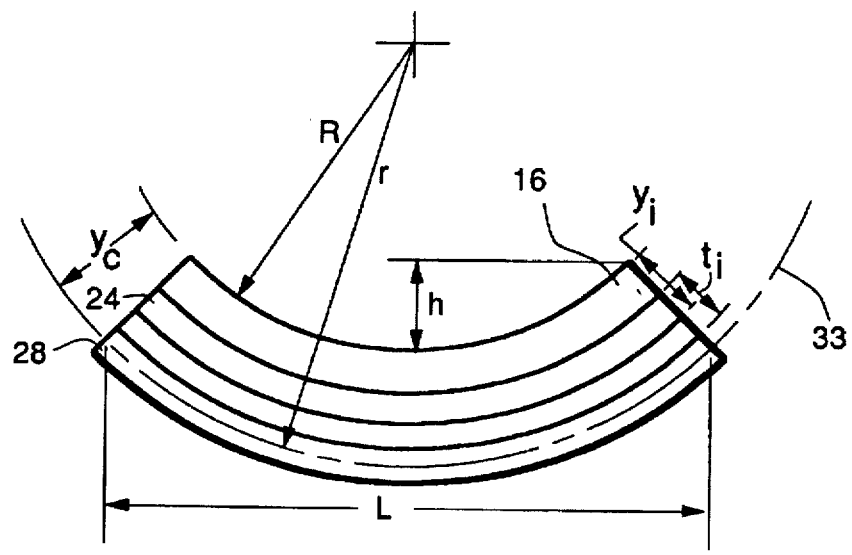
FIG. 2.
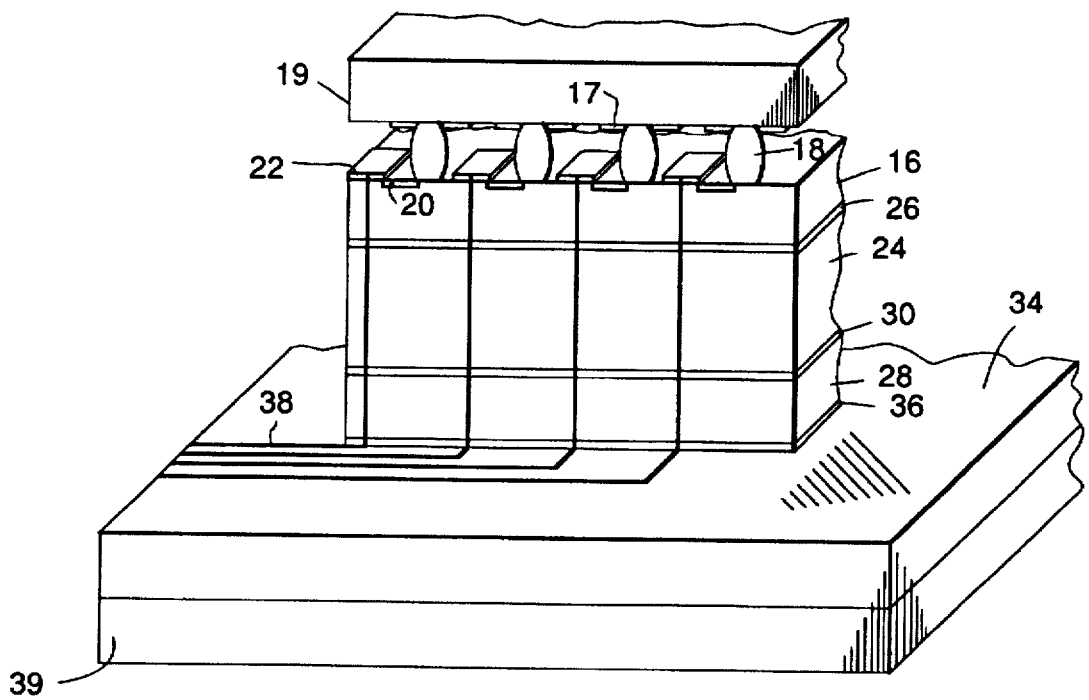
FIG. 3.
FIG. 5.
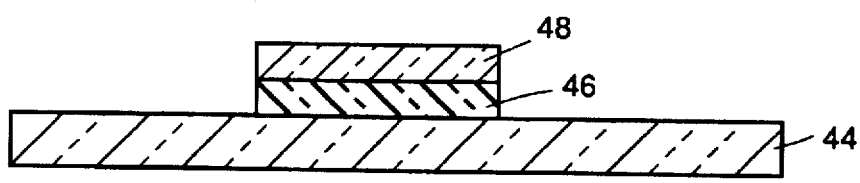

5,672,545

THERMALLY MATCHED FLIP-CHIP DETECTOR ASSEMBLY AND METHOD

BACKGROUND OF THE INVENTION

1. Field of the Invention

The present invention generally relates to matching the thermal coefficients of expansion (TCE) between bonded materials, and more specifically to a flip-chip detector assembly and a method for matching the detector and readout chips' TCEs.

2. Description of the Related Art

Flip-chips typically include an electromagnetic radiation detector chip electro-mechanically connected to a semiconductor readout chip via soft metal bumps. An infrared flip-chip detector is disclosed by Norton, "Infrared Image Sensors", *Optical Engineering*, Vol. 30, No. 11, November 1991, pp. 1649–1663. The thermal coefficient of expansion (TCE) of the detector chip can be 3–4 times the TCE of the readout chip. Some infrared detectors operate at a liquid nitrogen temperature of 77° K. and are cooled by either electrically powered closed cycle cryogenic cooling or gas. To conserve power or gas, the detectors are only turned on and cooled when necessary, and otherwise are turned off and maintained at room temperature, approximately 300° K. Thermal cycling the detector causes the chips to expand and contract at different rates, which can warp the detector and stress the fragile interconnections. The connections become fatigued over time and may eventually break. The stress on the interconnections increases as the TCE mis-match between the detector and readout chips becomes larger, which shortens the detector's expected lifetime and reduces its reliability.

A typical infrared detector chip includes a HgCdTe radiation sensitive circuit that is formed on the underside of a CdZnTe substrate having a TCE of 3.82 μm/m-° K. for the desired temperature range of 77°–300° K. that is indium bump mounted on a silicon readout chip having a TCE of 1.14 μm/m-° K. The reliability of the detector's indium bump connections has been estimated by thermal cycling a sample of detectors over their normal operating range; after only 200 cycles approximately 300 connections out of a possible 1920 fail. In production, the detectors are calibrated by thermal cycling them up to about ten times and measuring their outputs for a known radiation pattern. The radiation passes through the substrate and is absorbed by the circuit, producing electrical signals on the indium bumps proportional to the radiation pattern's intensity. In only ten cycles the number of indium bump failures will be extremely low, but the connections can be fatigued by the relative motion and warping of the detector and readout chips.

The calibrated detectors are then mounted onto a platform with other chips and circuitry by bonding the readout chip with a thin layer of epoxy to the platform and wire bonding the detector's pads to leads on the platform. A common platform is alumina (Al$_2$O$_3$), which has a TCE of 3.23 μm/m-° K. that is close to the detector's TCE, and a thickness 3–4 times that of the readout chip's. Bonding two dissimilar materials creates a composite structure that exhibits a TCE equal to the average of their TCEs, weighted by their thicknesses and Young's modulii. The platform tries to increase the expansion of the readout chip, while the readout chip tries to reduce the platform's expansion. The sheering force at the materials' interface causes the structure to warp when the temperature changes. The readout chip's effective TCE is increased to a value between 1.14 and 3.23 μm/m-° K., closer to 3.23, which reduces the stress on the indium bumps due to the thermal mismatch of the detector and readout chips, but the mismatch between the platform and readout chip can cause it to warp and stress the connections. A representative sample of detectors were cycled between 80° K. and 300° K. to test their long term reliability and expected lifetime, and resulted in more than 300 connection failures out of a possible 1920 at 700 cycles. The results are an improvement over the unmounted assembly but still exhibit a relatively short lifetime, low reliability and high cost per unit. Other platform materials, such as beryllium (Be), exhibit structural and thermal properties that are superior to the alumina platform but do not match the detector's TCE, and thus are not suitable for direct mounting of the flip-chip detector.

A method for matching the TCE of a silicon chip to a ceramic substrate is disclosed by Liu, "Matching the thermal coefficients of expansion of chips to module substrate", *IBM Technical Disclosure Bulletin*, Vol. 19, No. 12, May 1977, pages 4666–4667. The silicon chip is mounted on the substrate via solder balls, which are fatigued during thermal cycling. To relieve the stress, a layer of copper and a layer of silicon each having the same thickness as the silicon chip are formed over the chip such that the composite si-cu-si structure is balanced and has the same TCE as the substrate. The structure is balanced when the outer layers are the same material and thickness, causing the shear at the si-cu-si interfaces due to TCE mismatch to offset each other and inhibit warping. The technique is not applicable to electromagnetic radiation detectors, however, since the upper copper and silicon layers would shade the underlying detector chip from the radiation and thus prevent it from being detected.

SUMMARY OF THE INVENTION

The present invention seeks to provide a thermally matched flip-chip detector assembly and a method for reducing the level of stress on flip-chip interconnections due to thermal mismatches between a detector chip and a readout chip and thereby increase the detector's reliability and allow for the use of preferred platform materials.

This is accomplished with a detector that includes a substrate which carries a radiation sensitive circuit and is flip-chip connected to a layer of semiconductor material which carries a readout circuit. The substrate has a TCE greater than the semiconductor layer such that, without the invention, cycling the detector over a predetermined temperature range would stress the flip-chip connections. A first compensation layer on the readout chip has a TCE greater than the substrate's, and a second compensation layer on the first compensation layer has a TCE approximately equal to the semiconductor layer's. The first and second compensation layers together with the semiconductor form a composite structure. The compensation layer materials and thicknesses are selected to establish a TCE for the composite structure that approximately matches the TCE of the substrate thereby avoiding the connection stress over the predetermined temperature range. In the preferred embodiment the composite structure is mounted on a platform, which has a TCE approximately equal to the substrate's.

For a better understanding of the invention, and to show how the same may be carried into effect, reference will now be made, by way of example, to the accompanying drawings.

BRIEF DESCRIPTION OF THE DRAWINGS

FIG. 2 is a sectional view of the assembly's readout chip and compensation layers exhibiting warping due to TCE mismatch;

FIG. 3 is a perspective view of the assembly of FIG. 1 mounted on an interconnection platform;

FIG. 5 is a sectional view of an alternative embodiment for compensating the platform.

DETAILED DESCRIPTION OF THE INVENTION

Figure 1:
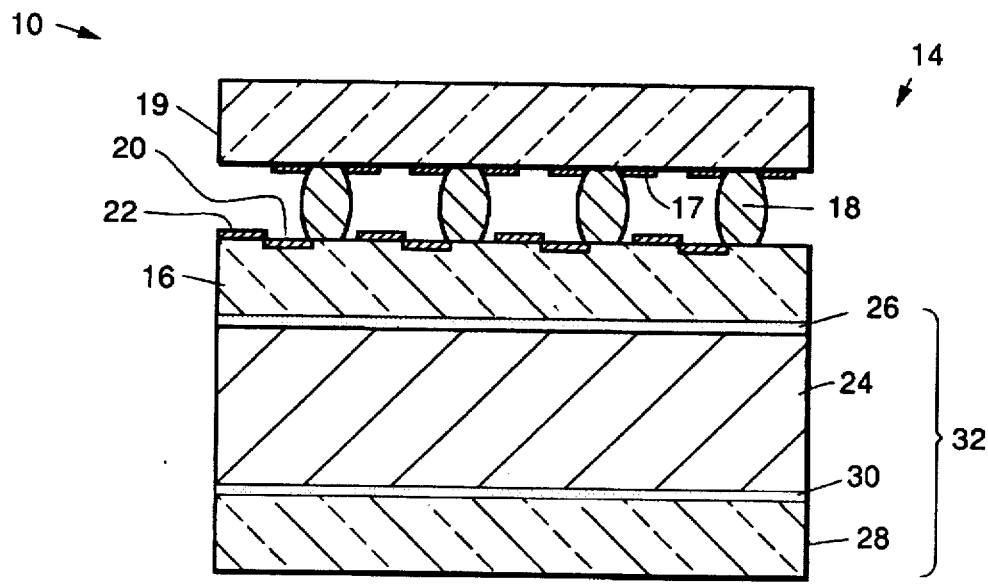
FIG. 1 is a sectional view of a TCE matched flip-chip detector assembly.

FIG. 1 is a sectional view of a TCE matched flip-chip detector assembly 10. A typical direct hybrid detector includes a detector chip 14 that is mechanically and electrically interconnected to a readout chip 16 via soft metal bumps 18, preferably indium. A suitable infrared detector chip 14 includes detection circuitry 17 that is formed from a radiation sensitive material such as HgCdTe on the underside of a substrate 19, preferably CdZnTe, in electrical contact with respective indium bumps. The substrate has a thickness of approximately 0.5 mm and a TCE of 3.82 μm/m-° K. for the temperature range from the liquid nitrogen temperature of 77° K. to room temperature of about 300° K. The circuitry 17 is approximately 15 μm thick and thus assumes the much thicker substrate's TCE. Therefore, the detector chip's TCE is essentially equal to that of the substrate.

The readout chip 16 is a semiconductor layer, preferably silicon with a TCE of 1.14 μm/m-° K. and a 0.48 mm thickness. The readout chip includes integrated circuitry 20 for reading out a pixelated radiation intensity pattern from the detector chip 14 and wire bond pads 22 for electrically connecting the detector assembly 10 to a platform or mother board to communicate the sensed pattern. A typical detector might have 1920 to 300,000 or more indium bump connections, which are very fragile and susceptible to damage due to stress or warpage. The detector is calibrated by cycling it up to about ten times between the room and liquid nitrogen temperatures and measuring its current outputs to known radiation patterns. Incident radiation passes through the substrate 19 and is absorbed by circuitry 17, producing electrical signals on the indium bumps 18 which are read out by circuitry 20. The calibration process can stress and permanently damage the detector's bump connections if the expansion mismatch between the detector and readout chips isn't compensated. The invention is applicable to other types of detector assemblies that exhibit similar mismatch problems.

To reduce the stress level and potential damage to the indium bumps during calibration and subsequent operation, a first compensation layer 24 of material having a TCE substantially greater than that of the substrate 19 is bonded with a thin epoxy layer 26, approximately 0.005 mm thick, to the exposed lower surface of the readout chip 16. A second compensation layer 28 of material having a TCE approximately equal to that of the readout chip is bonded with another thin epoxy layer 30 to the exposed surface of the first compensation layer 24. The compensation layer materials and their respective thicknesses are selected such that the TCE of a composite structure 32 comprising the semiconductor readout chip 16 and the first and second compensation layers 24 and 28 is between that of the readout chip 16 and the substrate 19, preferably equal to the substrate's TCE. Furthermore, the second compensation layer can be selected to match the readout chip's material and thickness to balance the composite structure such that the sheering forces at its two interfaces offset each other and inhibit warping to avoid stress on the detector's bump connections.

FIG. 2 is a sectional view of the composite layer of FIG. 1, disregarding the epoxy layers. The warping produced in an unbalanced structure is shown in exaggerated form; in an ideally balanced structure there would be no warping. The strain ε represents the fractional change in length of a material and equals its TCE times the temperature range, $\alpha_i * \Delta T$. The difference between the readout and detector chips' strains creates a shear that fatigues and can eventually break the metal interconnections. As shown in FIG. 2 the neutral axis 33 equals the axis of zero strain, and:

$y_c$=distance from neutral axis to readout chip's surface $y_i$=distance from the readout chip's surface to center of $i^{th}$ layer $t_i$=thickness of $i^{th}$ layer $E_i$=Young's modulus of $i^{th}$ layer $\alpha_i$=thermal coefficient of expansion (TCE) of $i^{th}$ layer $\Delta T$=final temperature minus initial temperature ε=strain in the readout chip $\epsilon_{DET}$=strain in the detector chip δ=sheer at bump interconnections h=warpage of readout chip L=length of layers R=radius of curvature of top layer.

In the most general case, the materials and thicknesses of the first and second compensation layers are variable. Assuming pure bending and uniform expansion across the semiconductor and compensation layers, the first order equations that describe the sheer and warpage at the bump interconnections are given by:

Area moment of inertia per unit width:

$$I_i = \frac{t_i^3}{12} + y_i^2 t_i \quad (1)$$

Radius of curvature of neutral axis:

$$r = \frac{(\Sigma E_i t_i y_i)^2 - (\Sigma E_i I_i)(\Sigma E_i t_i)}{(\Sigma E_i t_i y_i)(\Sigma E_i t_i \alpha_i \Delta T) - (\Sigma E_i t_i)(\Sigma E_i t_i y_i \alpha_i \Delta T)} \quad (2)$$

where (Σ) represents the summation over i for the readout and compensation layers, Distance from neutral axis to readout chip:

$$y_c = \frac{(\Sigma E_i I_i)(\Sigma E_i t_i \alpha_i \Delta T) - (\Sigma E_i t_i y_i)(\Sigma E_i t_i y_i \alpha_i \Delta T)}{(\Sigma E_i t_i y_i)(\Sigma E_i t_i \alpha_i \Delta T) - (\Sigma E_i t_i)(\Sigma E_i t_i y_i \alpha_i \Delta T)} \quad (3)$$

Strain in readout chip:

$$\epsilon = -y_c / r \quad (4)$$

Sheer at interconnections:

$$\delta = (\epsilon - \epsilon_{DET}) * L/2 \quad (5)$$

Radius of curvature of readout chip:

$$R = r - y_c \quad (6)$$

Warpage of readout chip:

$$h = R[1 - \sqrt{1 - (L/2R)^2}\,] \quad (7)$$

The materials and thickness of the two compensation layers are selected to reduce the sheer δ, which is the difference between the deflections at the detector ($\alpha_{DET}\Delta T*L/2$) and readout chips ($\epsilon L/2$), and the warpage h of the readout chip. The equations are valid for an arbitrary number of compensation layers and can be used to match the readout chip, first and second compensation layers, and a mounting platform to the detector chip.

The composite structure can be balanced to inhibit warping by matching the second compensation layer to the readout chip, and its composite TCE can be matched to the detector chip's TCE to minimize the stress and damage that normally occurs during calibration. For a balanced and matched structure, there is ideally no warping and the strain equation simplifies to picking the material for the first compensation layer to specify $E_i$ and $\alpha_i$, and then solving for its thickness $t_i$ to equalize the detector and readout chips' strains. The simplified strain equation is given by:

$$\epsilon = \frac{\Sigma E_i t_i \alpha_i \Delta T}{\Sigma E_i t_i} \quad (8)$$

and is set equal to the detector's strain $\epsilon_{DET}$. A suitable flip-chip detector would comprise a 15 μm detection circuit on the underside of a 0.5 mm CdZnTe substrate connected via indium bumps to a 0.48 mm silicon readout chip, a first titanium compensation layer approximately 1.24 mm thick and a second silicon compensation layer 0.48 mm thick with a TCE that matches the TCE of the silicon readout. Be, cu or other materials with sufficiently high TCEs can be used instead of titanium.

FIG. 3 is a perspective view of the flip-chip detector assembly 10 of FIG. 1 mounted on an interconnection platform 34. The second compensation layer 28 is bonded with an epoxy 36, approximately 0.05 mm thick, and the wire bond pads 22 are electrically connected to a fan-out, feedthroughs or a ribbon cable 38 on the platform. The platform can be mounted on a coldfinger end cap 39, suitably kovar, beryllium, molybdenum or alloy 39 to control the detector's temperature during thermal cycling. Nitrogen or Helium gas is pumped through a tube to the end cap and cools the detector to approximately 77° K. The platform can be a ceramic material, such as alumina ($Al_2O_3$) 1.75 mm thick, which has a TCE fairly close to the detector's, or a metal such as beryllium (Be) which has a significantly higher TCE (5.–73 μm/m-° K.). In many applications a beryllium platform is preferable because it is a very good thermal conductor, has a high degree of stiffness, a low specific heat, i.e. it doesn't store heat, and is relatively light weight.

The materials from which the composite structure 32 is formed can be selected using equation 8 to provide a balanced structure with a TCE matched to that of the detector chip. When mounted, the composite TCE of the composite structure and the platform shifts in accordance with the platform's TCE and thickness, causing a degree of mismatch that stresses the indium bump interconnections. For a ceramic platform the mismatch, and hence the stress, is relatively small. However, for a metal platform the mismatch is substantial and the resulting stress is sufficient to reduce the assembly's reliability significantly.

Another approach is to select the first and second compensation layers in accordance with equations 1–7 to match the composite TCE of the mounted assembly (composite structure and platform) to the detector chip's TCE to reduce the stress on the bump connections during operation. This approach produces a degree of mismatch in the unmounted assembly, causing some stress during calibration. However, the number of thermal cycles during calibration is far fewer than the expected number over the detector's lifetime, so that matching the final structure is more important than matching the intermediate assembly.

Figure 4:
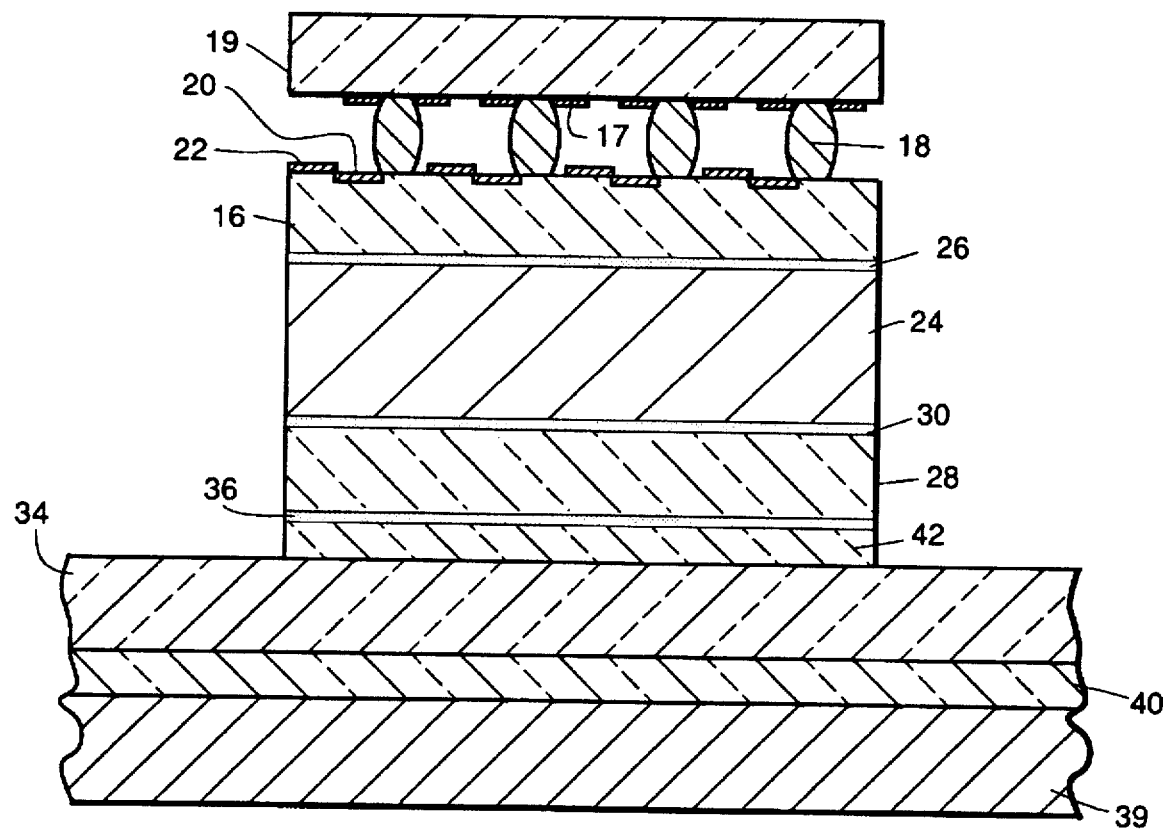
FIG. 4 is a sectional view of the mounted assembly of FIG. 3 that includes platform compensation layers.

FIG. 4 is a sectional view of the mounted assembly of FIG. 3 with an alternative structure for compensating a TCE mismatch between the platform and the detector chip. In this approach the first and second compensation layers 24 and 28 are preferably selected to match the TCE of the composite structure to the detector chip to reduce the stress during pretest as much as possible. A single layer 40, suitably silicon, is formed on either the top or bottom of platform 34 such that their composite TCE also matches the detector chip's. A second layer 42 with a TCE and thickness that matches the TCE and thickness of layer 40 is preferably formed on the platform's opposing surface to create a balanced structure to resist warping, with the thickness of layers 40 and 42 adjusted so that the composite TCE of the platform 34 and the two layers 40 and 42 matches the detector chip TCE. This allows the intermediate and final assemblies to each match the detector chip's TCE, thereby increasing the reliability of the bump interconnections. The drawback is that one or two additional layers must be formed on the platform, which increases heat storage and weight.

FIG. 5 is a sectional view of an alternative structure for compensating a TCE mismatch between the platform and the detector chip. In this configuration both compensation layers are formed on top of a platform 44. A first compensation layer 46, suitably silicon, is formed on top of the platform. A second compensation layer 48, preferably having a TCE and thickness that matches the TCE and thickness of the platform, is formed on the first compensation layer to create a balanced structure to resist warping. The detector chip assembly shown in FIG. 1 can be mounted on compensation layer 48. The thickness of layers 46 and 48 are adjusted so that the composite TCE of the platform 44 and two compensation layers matches the detector chip TCE.

By providing compensation layers between the detector and the platform, the detector's expected life and reliability are increased by reducing the stress on the its metal connections. Furthermore, platform materials can be selected that provide superior electrical and structural properties without significantly diminishing the detector's reliability.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims. In the described embodiment the detector chip's TCE is greater than the readout chip's TCE, and the composite structure is selected to increase the readout chip's effective TCE to approximately that of the detector chip. The invention is also applicable if the detector chip's TCE is less than the readout chip's TCE, and the approach of selecting the composite structure to equalize the expansion coefficients would be equivalent. In the described embodiment the platform's TCE can be greater than the detector chip's TCE, and the compensation layers are selected to decrease the platform's effective TCE to approximately that of the detector chip. The invention is also applicable if the platform's TCE is less than the detector chip's TCE, and the approach of selecting the compensation layers to equalize the expansion coefficients would be equivalent.

We claim:

1. A method for reducing thermal stress in flip-chip assemblies, comprising:

providing a detector that includes a radiation sensitive circuit on a substrate that is flip-chip connected to a layer of semiconductor material, said substrate having a TCE greater than the semiconductor layer;

forming a first compensation layer on said semiconductor having a TCE greater than said substrate's and a first thickness;

forming a second compensation layer on said first compensation layer having a TCE approximately equal to the semiconductor layer's and a second thickness, the materials of said compensation layers and their thicknesses being selected to produce a composite structure of the semiconductor and compensation layers having a composite TCE that is greater than the semiconductor layer's TCE and less than or equal to the substrate's TCE; and mounting said detector onto a platform by bonding said second compensation layer to the platform to produce a second composite TCE of the composite structure and platform that is approximately equal to the substrate's TCE.

2. A method for reducing thermal stress in flip-chip assemblies, comprising:

providing a detector that includes a radiation sensitive circuit on a substrate that is flip-chip connected to a layer of semiconductor material, said substrate having a TCE greater than the semiconductor layer;

forming a first compensation layer on said semiconductor having a TCE greater than said substrate's and a first thickness;

forming a second compensation layer on said first compensation layer having a TCE approximately equal to the semiconductor layer's and a second thickness, the materials of the first and second compensation layers and their thicknesses being selected to produce a composite structure of the semiconductor and first and second compensation layers having a composite TCE that is about equal to the substrate's TCE;

providing a mounting platform for mounting said detector;

forming a third compensation layer on said platform, and forming a fourth compensation layer on said third compensation layer, the materials of said third and fourth compensation layers and their thicknesses being selected to produce a composite platform structure of the platform and third and fourth compensation layers having a composite TCE that matches the substrate's TCE;

mounting said detector onto said platform by bonding said second compensation layer to one of said fourth compensation layer or said platform to produce a second composite TCE of the composite structure and the composite platform structure that is approximately equal to the substrate's TCE.

* * * * *